United States Patent [19]

Cortellino et al.

[11] 4,429,983

[45] Feb. 7, 1984

[54] DEVELOPING APPARATUS FOR EXPOSED PHOTORESIST COATED WAFERS

[75] Inventors: Charles A. Cortellino, Wappingers Falls; Joseph E. Levine, Poughkeepsie; Henry C. Schick, Hopewell Junction, all of N.Y.

[73] Assignee: International Business Machines Corporation, Armonk, N.Y.

[21] Appl. No.: 360,157

[22] Filed: Mar. 22, 1982

[51] Int. Cl.³ .......................... G03D 3/04; G03D 3/06
[52] U.S. Cl. .................................. 354/320; 354/324; 354/330; 134/102; 134/148; 134/161
[58] Field of Search ............... 354/320, 323, 324, 325, 354/329, 330, 328; 34/229; 134/95, 99, 102, 140, 148, 149, 153, 161, 144

[56] References Cited

U.S. PATENT DOCUMENTS 3,769,992  11/1973  Wallestad ............................ 134/144
3,849,906  11/1974  Hansen et al. ........................ 34/229
3,990,462  11/1976  Elftmann ............................ 134/102
4,132,567   1/1979  Blackwood ......................... 134/153
4,161,356   7/1979  Giffin et al. ........................ 354/323
4,197,000   4/1980  Blackwood ......................... 354/323
4,286,541   9/1981  Blackwood ......................... 134/102

Primary Examiner—A. A. Mathews
Attorney, Agent, or Firm—Joseph G. Walsh

[57] ABSTRACT

This developer station comprises a developing tank arranged with a centrally located rotatable and vertically translatable shaft carrying a workpiece platform at the upper end thereof. Initially, the platform is located above the tank for ease in loading a workpiece, for example an exposed photoresist coated semiconductor device component. The workpiece is then lowered into developing solution in the tank where it is rotated and oscillated vertically for agitational action during a predetermined time period after which it is raised up out of the solution and delayed at a drying station for another predetermined time period. Thereafter, the workpiece is returned to the initial position for unloading.

10 Claims, 1 Drawing Figure

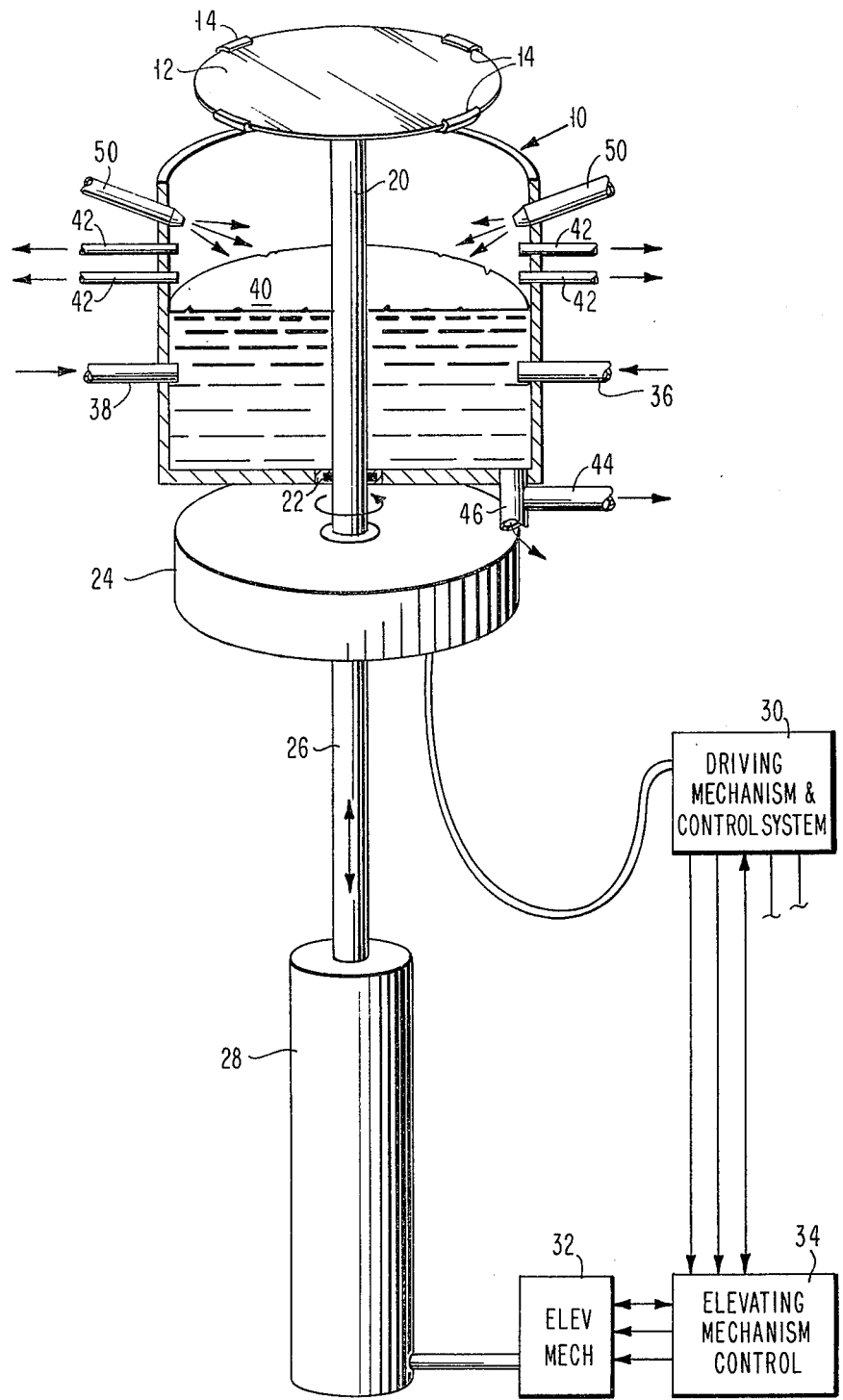

DEVELOPING APPARATUS FOR EXPOSED PHOTORESIST COATED WAFERS

FIELD

The invention relates to apparatus for liquid chemical processing of photoresist coatings, and it particularly pertains to such apparatus for developing exposed resist coatings on semiconductor wafers in the fabrication of integrated circuit devices.

BACKGROUND

The development of photoresist coatings on semiconductor components has considerable history. Initial hand processing has given way to semi-automatic or automatic apparatus. Such apparatus generally incorporates spraying and/or dipping arrangements usually necessitating containers or covers and therefore involving cumbersome loading and unloading provisions. The added cost in processing semiconductor wafers by means of arrangements having cumbersome loading and unloading procedures alone is tremendous.

SUMMARY

The objects referred to indirectly hereinbefore and those that will appear as the specification progresses are attained in an assembly comprising a developing tank arranged with a centrally located rotatable and vertically translatable shaft carrying a workpiece platform at the upper end thereof. Initially, the platform is located above the tank for ease in loading a workpiece, for example an exposed photoresist coated semiconductor device component. The workpiece is then lowered into developing solution in the tank where it is rotated and oscillated vertically for agitational action during a predetermined time period after which it is raised up out of the solution and delayed at a drying station for another predetermined time period. Thereafter, the workpiece is returned to the initial position for unloading.

Conventional driving and elevating mechanisms and control systems are available for automatically raising, lowering, and rotating the platform. Likewise, conventional arrangements are available for filling the tank and draining the solutions, blow-drying the workpiece and removing fumes that may develop.

The invention does have some component structure in common with prior art arrangements of which examples are found in the following U.S. Pat. Nos.:

| | | | |
|---|---|---|---|
| 3,769,992 | 11/1973 | Wallestad | 134/144 |
| 3,849,906 | 11/1974 | Hansen, et al. | 34/229 |
| 4,161,356 | 7/1979 | Giffin, et al. | 354/323 |
| 4,197,000 | 4/1980 | Blackwood | 354/323 |

Each of these patents show and describe apparatus for processing a workpiece, or a plurality thereof, by rotating the workpiece and subjecting it to one or more spraying and/or air drying actions, but without any agitation of fluid or oscillation of the workpiece in a direction normal to the axis of rotation as is carried out in one of the more important aspects of the apparatus ascending to the invention.

DRAWING

In order that all the advantages of the invention obtain in practice, a description of the preferred and best mode embodiment thereof, given by way of example only, is described in detail hereinafter with reference to the accompanying drawing, forming a part of the specification, and in which:

The sole FIGURE of drawing is a schematic diagram of developing apparatus for exposed photoresist coatings on substrates according to the invention.

DESCRIPTION

The developing apparatus according to the invention is readily embodied in a tank 10 preferably of stainless steel or like material about 25 cm (10 in.) in diameter and 30 cm (12 in.) high. This tank 10 need not be covered while in use and may be fully open as shown. If desired, a partial cover is used, but room is left in which to pass a platform 12 freely into and out of the tank 10. Fundamentally, this platform 12 is a workpiece holder and is conventional in construction. A number, preferably four, of spring loaded clamps 14, also conventional in construction, are arranged about the periphery for holding a workpiece (not shown), for example a semiconductor wafer having an exposed photoresist coating. The workpiece holder is fixed to a shaft 20 extending down through a liquid tight gland 22 in the bottom of the tank 10. This gland 22 permits the shaft 20 to be rotated and longitudinally translated with little friction. As shown, the shaft 20 is fixed to the shaft of a variable speed driving motor 24 capable of rotating the shaft and the platform 12 from zero to 2000 r.p.m. The motor is supported by another shaft 26 which also serves as a piston in a cylinder 28 of a hydraulic elevating mechanism for raising and lowering the platform 12. The essentials of a driving and elevating mechanism and control therefore are found in the drawing where the driving mechanism and central system 30, the elevating mechanism 32 and the elevating mechanism control 34 are conventional apparatus well-known in the art.

The tank 10 is fitted with a plurality of inlet tubes 36 and 38 for supplying developing fluid, or "developer", to the tank. This developing fluid, for example, 1 part of heptanone to 4 parts hexyl acetate for developing 4250 Å poly methyl methacrylate (PMMA) film, is supplied to the tank to a level indicated by a wavy line 40 and maintained at a temperature of 40° C. Fumes that may be given off by a developer are removed by means of a plurality of vacuum lines 42. The tank 10 is fitted with a combination return line fitting 44 and a drain valve 46. The vacuum lines eventually lead to a sump or bulk storage tank in common with that to which the return line leads in conventional fashion. A plurality of jets 50,50 inject nitrogen at 3.52 KgCm$^{-2}$ (50 psi) at a level in the tank just above a drying station. Preferably a jacket (not shown) is fitted about the tank for maintaining the temperature between 5° C. and 90° C. controlled to ±0.1° C. by circulating water in a conventional fashion.

In operation, a workpiece, for example a coated wafer, is inserted in the clamps 14 of the platform 12. The platform is then lowered to a level near and preferably a centimeter or so above the inlet tubes 50, where the platform is rotated and at the same time oscillated vertically 2–3 cm (on the order of an inch) for a short time period, for example, of 10 minutes for 4250 A° PMMA film. This combined rotation and vertical oscillation throughby agitates the solution whereby there is a continuous flow of fresh developer across the platform. The platform is then raised out of the solution to a position between the vacuum outlets 42,42 and the nitrogen inlets 50,50 where it is halted for three minutes while the nitrogen dries the still rotating workpiece. Thereafter, the rotation is stopped and the flatform raised to the uppermost position for unloading and reloading.

As shown in the drawing, the motor 24 is raised and lowered with the shaft 20. Alternately, the motor is fixed in relationship to the cylinder 28 and the shaft 20 is a splined shaft arranged within the shaft of the motor for vertical translation therein.

While the invention has been described in terms of an express embodiment, and alternatives have been suggested, it is clearly to be understood that those skilled in the art will effect further changes in form and in substance without departing from the spirit and scope of the invention as defined in the appended claims concluding the specification.

The invention claimed is:

1. Developing apparatus comprising:
   a tank having an opening at the top thereof and having a substantial fluid tight gland in the bottom thereof,
   an elongated shaft movably mounted in said gland for vertical and rotational movement therein,
   a driving mechanism coupled to said shaft for producing said rotational movement thereof,
   an elevating mechanism coupled to said shaft for producing said vertical movement thereof,
   a platform arranged on the upper end of said shaft,
   a control system coupled to said elevating mechanism for raising said platform to a rest position above said tank for loading said platform, for lowering said platform into said tank to a given depth, for oscillating said platform between said given depth and a predetermined depth above said given depth, and for again raising said platform to said rest position for unloading said platform in readiness for subsequent reloading thereof.

2. Developing apparatus as defined in claim 1 and wherein
   said control system is also arranged to stop vertical movement of said platform at a prearranged depth in said tank above said given and said predetermined depths for a prearranged time period and then continue upward vertical movement.

3. Developing apparatus as defined in claim 1 and incorporating
   control circuitry connected to said driving mechanism and coupled to said control system for rotating said shaft at predetermined portions of the vertical movement cycle.

4. Developing apparatus as defined in claim 1 and wherein
   said tank has a fluid inlet arrangement in the sidewall thereof at a level on the order of said given depth for filling said tank to a depth above said predetermined depth and below predetermined depth, and
   said tank also has a fluid outlet at the bottom thereof for removal of said fluid.

5. Developing apparatus as defined in claim 4 and wherein
   said tank has at least one outlet arrangement above the depth of fluid for removing fumes derived from said liquid.

6. Developing apparatus as defined in claim 2 and wherein
   said tank has at least one inlet arrangement above said prearranged depth for blowing a gaseous medium on said platform.

7. Developing apparatus as defined in claim 1 and wherein
   said driving mechanism is an electric motor.

8. Developing apparatus as defined in claim 7 and wherein
   said electric motor is elevated with said shaft.

9. Developing apparatus as defined in claim 1 and wherein
   said elevating mechanism is a hydraulic cylinder and piston arrangement.

10. Developing apparatus as defined in claim 1 and wherein
    said platform is equipped with spring loaded clamps.

* * * * *